United States Patent [19]

Colwill

[11] 4,138,709

[45] Feb. 6, 1979

[54] PROXIMITY SWITCH

[75] Inventor: John A. Colwill, Quorn, England

[73] Assignee: Square D Company, Park Ridge, Ill.

[21] Appl. No.: 771,870

[22] Filed: Feb. 25, 1977

Related U.S. Application Data

[63] Continuation of Ser. No. 624,684, Oct. 22, 1975, abandoned.

[51] Int. Cl.² .............................................. H01H 36/00
[52] U.S. Cl. ..................................... 361/180; 307/116; 328/5; 340/674
[58] Field of Search ............ 361/180; 307/116, 252 R, 307/252 A, 252 J, 252 P; 328/5; 340/258 B, 258 C; 331/65, 117 R, 185, 186

[56] References Cited

U.S. PATENT DOCUMENTS 3,919,661  11/1975  Buck ................................ 361/180 X

FOREIGN PATENT DOCUMENTS 1924279  10/1972  Fed. Rep. of Germany.

Primary Examiner—Herman J. Hohauser
Attorney, Agent, or Firm—Michael J. Femal

[57] ABSTRACT

A proximity switch is connected to close a circuit between a source and a load when a metal object is adjacent to a coil in the switch. The coil is part of an oscillator circuit that is selected to have its output damped below a selected amplitude when the metal object is close enough to the coil. The reduced amplitude of oscillation opens a capacitor shunting switch thereby permitting the capacitor to be charged. The charging of the capacitor to a selected level turns on an SCR to connect the load to the source through the SCR. A power storage circuit has a capacitor that is charged when the SCR is turned off to provide operating current for the circuits of the switch when it is not available because the SCR is turned on to shunt the current from the main power source. A circuit for controlling the proximity switch upon initial energization prevents spurious operation with a switching circuit that does not turn on until after a selected period of time after energization of the proximity switch from the main power source.

18 Claims, 1 Drawing Figure

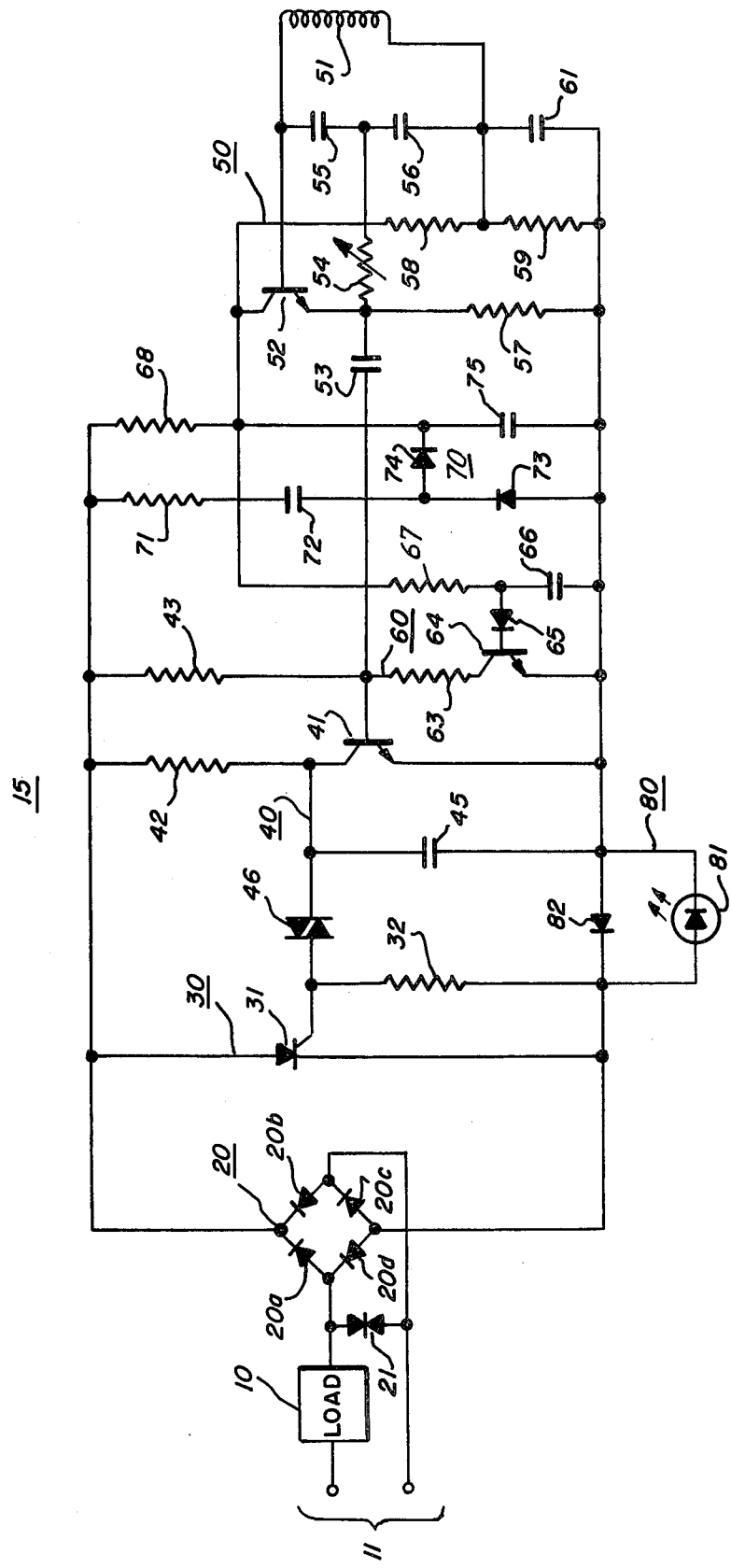

PROXIMITY SWITCH

This is a continuation of application Ser. No. 624,684, filed Oct. 22, 1975 now abandoned.

This invention relates to proximity switches, particularly to proximity switches that operate in response to metal objects adjacent to the proximity switch.

Proximity switches are devices used to sense the presence of objects, generally metallic objects, so that an output can be produced indicating the presence or nearness of the object. Typically they are used as position switches or in a production line counting operation where objects are counted. In these types of applications the proximity switch is connected in series between an electrical source and a load that is typically a motor, or counter or similar device.

With this invention a proximity switch is controlled by control circuitry that effectively responds to the presence of metallic objects and provides a reliable means for sensing the presence of the object and connecting the load to the source with effective safeguards to ensure that accurate counting or position indication is supplied. In addition an inhibiting circuit prevents spurious operation upon initial energization and a power storage provides power when the switch is turned on to shunt current through the power source.

The advantages and objects of this invention will be apparent from the following description.

The FIGURE is a schematic of the circuitry of a proximity switch according to this invention.

Referring to the FIGURE, a load 10 is connected to a suitable alternating current source 11 through a proximity switch 15. The proximity switch is of any generally known physical structure that typically comprises a mounting assembly for the electronic circuitry all of which is typically enclosed in a plastic casing with a sensing coil mounted in a outward location suitable for sensing the presence of a metallic object. The proximity switch is of a type that is connectable in series with a source and a load and is energized from the source through the load, and that upon sensing the presence of a metallic object shunts the source current through the proximity switch to thereby connect the source to the load.

Proximity switch 15 comprises a rectifying means 20 for rectifying the alternating current from the source connected in series with the load and power source; a switching means 30 for connecting the source to the load through the rectifying means; a switching control means 40 for controlling switching means 30; a sensing means 50 comprising an oscillator circuit responsive to a metallic object in a selected location for producing an output indicating the presence of a metallic object within a selected distance; an operational delay means 60 for controlling the switching control means to allow stabilization of the circuit conditions upon initial energization before permitting operation; an energy storage means 70 for storing electrical energy to furnish power to the circuit when power is not available from power source 11 because of the shunting of the power source current by switching means 30; and an indicating means 80 for signalling the operation of the switching means to connect the source to the load.

Sensing means 50 comprises an inductive device such as a coil 51 connected to the remaining circuitry of the sensing means by a suitable conductor so that typically it may be placed in the casing of the proximity switch in a position suitable for sensing the presence of a metallic object, that is, in a position where the presence of a metallic object will influence the magnetic field of the coil operating in an oscillator circuit. Sensing means 50 also comprises a transistor 52, a coupling capacitor 53, an adjustable resistor 54, capacitors 55 and 56 connected in an oscillator circuit configuration with transistor 52 and coil 51, a bias resistor 57, a bias resistor 58, a bias resistor 59, and a decoupling or filtering capacitor 61. The components and their values are selected so that transistor 52 drives a tuned oscillator circuit having coil 51 and capacitors 55 and 56 through adjustable feedback resistor 54. The circuit is appropriately biased by resistors 58, 59 and 57 and decoupling capacitor 61 provides a steady d.c. bias voltage regardless of any transients that may be picked up through coil 51. The circuit is typically tuned to oscillate at a relatively high frequency, about 200 kilohertz, relative to the power source frequency to provide an output through coupling capacitor 53. Under the selected biasing and feedback conditions, as determined by adjustable resistor 54, oscillation in the oscillator circuit occurs but its amplitude is significantly damped to a preselected level whenever a metallic article of a selected type is within a selected distance from coil 51.

The output from sensing means 50, the oscillating signal appearing at coupling capacitor 53, is applied to switching control means 40. Switching control means 40 comprises a control switching device such as a transistor 41, a resistor 42, a biasing resistor 43, a biasing circuit made up of a biasing resistor 63 and a switching device such as a transistor 64 that also comprises part of operational delay means 60, a switching capacitor 45, and a bidirectional threshold diode 46 having a selected breakdown or threshold voltage. Switching control means receives the output of sensing means 50 as an input to transistor 41. The component values are selected so that when transistor 64 is turned on, transistor 41 is biased to turn on during a selected portion of each positive half-cycle of the oscillator output, at the relatively high frequency rate of the oscillator, to thereby shunt and discharge capacitor 45 and prevent it from being charged to any significant level by the power source.

When a metallic object is within the selected distance from coil 51 of sensing means 50, the amplitude of oscillation in the oscillator circuit is reduced so that insufficient positive signal appears at the base of transistor 41 and transistor 41 remains turned off. With transistor 41 turned off, capacitor 45 is charged from power source 11 through the load and rectifying means 20 at a rate selected by the values of the resistance and capacitance of resistor 42 and capacitor 45. When the voltage level across capacitor 45 reaches a predetermined level the breakdown voltage of bidirectional diode 46 is equalled and capacitor 45 discharges through diode 46, the gate-cathode junction of an SCR 31, and a light emitting diode 81 of indicating means 80. This discharge turns on the switching means.

Switching means 30 essentially comprises SCR 31 and a leakage resistor 32 that provides a path for the anode-gate leakage current. Upon receiving the positive voltage at the gate of SCR 31, SCR 31 is turned on and current flows through SCR 31 and rectifying means 20 through the load. The turning on of SCR 31 is enhanced by the rapid discharge of capacitor 45 that occurs because of the avalanche characteristics of bidirectional diode 46 which has a much lower conduction voltage than breakdown voltage.

Rectifying means 20 comprises four diodes, 20a, 20b, 20c and 20d, connected in a full wave rectification bridge configuration and a double diode 21 connected across the power circuit to provide a path for transient peak voltages that may occur in the circuits of load 10 or power source 11.

Operational delay means 60 is connected in the base circuit of transistor 41 of the switching control means to delay operation of the proximity switch upon initial energization. Since the use of proximity switches in counting or position indicating situations make it desirable that a count or indication not be produced erroneously upon initial energization, operational delay means 60 is connected so that upon initial energization of the proximity switch, transistor 64 is turned off insuring that transistor 41 is turned on by the applied positive potential through resistor 43, regardless of the output of the oscillator of sensing means 50. The turned on condition of transistor 41 keeps capacitor 45 discharged so that a voltage sufficient to turn on SCR 31 does not occur. Operational delay means 60 comprises transistor 64, a diode 65, a capacitor 66, a bias resistor 67, a resistor 63, and a resistor 68.

Upon the initial energization of the circuit, transistor 64 is turned off and transistor 41 cannot turn off in response to the output of the oscillator circuit of sensing means 50. As the energization continues capacitor 66 begins to charge through resistor 68 and 67 and from an energy storage capacitor 75 in energy storage means 70. When the charge on capacitor 66 reaches a selected voltage, transistor 64 is turned on as current flows through diode 65 and the base-emitter junction of transistor 64. With transistor 64 turned on the biasing circuit of transistor 41 comprises resistor 43, resistor 63 and the collector-emitter circuit of transistor 64 which are selected to provide the desired bias on transistor 41 so that it will turn on during the positive half-cycles produced by the oscillator.

During operation of the proximity switch, when SCR 31 is turned on the current is shunted through the SCR and there is insufficient current and voltage available from power source 11 to operate the circuitry and provide the necessary biases to maintain stable operation. To enable the energy storage means to provide power for those periods when SCR 31 is turned on the characteristics of and the components in the switching control means are selected to provide a time delay circuit so that SCR 31 does not turn on until the positive voltage in any half-cycle of source 11, after rectification by rectifier 20, is at or has reached a minimum preselected level. This level results from the firing delay time of SCR 31 as controlled by the characteristics of switching control means 40, particularly the breakdown voltage of bidirectional diode 46 and the charge rate of capacitor 45 through resistor 42. The level is selected to insure that sufficient electrical energy from source 11 is stored by energy storage means 70 at the time of switching so that there is sufficient power at a suitable voltage for the operation of the circuits when insufficient voltage is available because of the shunting effect of SCR 31. Energy storage means 70 comprises a resistor 71, a coupling capacitor 72, a diode 73, a diode 74, resistor 68, and energy storage capacitor 75. Capacitor 75 is charged through resistor 68 in parallel with diode 74 and the low impedance network comprising resistor 71 and capacitor 72 so that an initial selected charge level is achieved by capacitor 75 during any period in a rectified half-cycle of source 11 available before the firing of the SCR. Between pulses, capacitor 72 discharges through resistor 71, other parts of the circuit, and through diode 73.

Indicating means 80 comprises light-emitting diode 81 which is turned on only when SCR 31 is turned on. Diode 81 is turned on by the discharge current from capacitor 45 through diode 46 and the gate-cathode junction of SCR 31. A diode 82 is connected to provide a path for operating current for the circuit, to block current in the discharge direction so that capacitor 45 discharges through diode 81 to turn it on, and to limit any reverse voltages appearing across diode 81.

Thus, in the operation of the circuitry shown, upon the positioning of a metallic object within a predetermined distance from coil 51, the amplitude of the oscillations in the oscillator circuit decrease below a selected level. This turns off transistor 41 and allows capacitor 45 to charge to a level sufficient to turn on SCR 31 and connect load 10 through rectifying bridge 20 and SCR 31 to power source 11. The characteristics of switching control means 40 are selected so that SCR 31 will only turn on at some positive voltage level so that capacitor 75 will be sufficiently charged. Capacitor 75 provides a power source during the period that SCR 31 is turned on to enable the operation of the circuitry despite the low potential across the circuit with SCR 31 conducting. Operational delay means 60 prevents spurious operation upon initial energization of the circuit by preventing operation of SCR 31 until capacitor 66 has charged. A visual indicating means is provided by light-emitting diode 81 which provides an indication of the operation of the circuit or of the count of a metallic object passing within the field of coil 51.

I claim:

1. A proximity switch of the type connectable in series with an electrical source and an electrical load, having portions energizable from the electrical source, and operable in response to the proximity of a metallic object to shunt current from the electrical source through the proximity switch and thereby connect the source to the load, said proximity switch comprising:
    a sensing means for producing a signal in response to the presence of a metallic object within a selected distance from the proximity switch;
    a switching means connected for connection between the source and the load for disconnecting said source from said load and connecting said source to said load by shunting the current from said source through said switching means;
    a switching control means responsive to the sensing means signal for controlling the swing means;
    an energy storage means for storing electrical energy received from the electrical source when said source is disconnected from the load by the switching means and for supplying electrical energy to selected portions of the proximity switch when said source current is shunted to said load through said switching means; and
    an operational delay means responsive to the initial connection of the proximity switch to the power source for turning on the control switching device to shunt the switching capacitor for a preselected time after said initial energization to thereby prevent the turning on of the silicon controlled rectifier for said preselected time.

2. A proximity switch according to claim 1 wherein said sensing means comprises an oscillator circuit having an inductive device positioned as a sensing device for the proximity switch and adjusted to produce an oscillating output that decreases in amplitude to produce the signal for the switching control means upon presence of a metallic object within said selected distance from said inductive device.

3. A proximity switch according to claim 2 wherein said switching control means comprises a switching capacitor shunted by a control switching device with said control switching device connected to be turned on by the oscillating signal from the sensing means to thereby discharge said switching capacitor.

4. A proximity switch according to claim 1 also comprising an operational delay means responsive to the initial connection of the proximity switch to the power source for controlling the switching control means to control the switching means to prevent connection of the source to the load for a preselected time after said initial energization irrespective of the sensing means output.

5. A proximity switch according to claim 1 wherein said operational delay means comprises a delay circuit connected to control the control switching device, said delay circuit having a switching device responsive to the initial energization of the proximity switch to turn on said control switching device to continuously shunt the switching capacitor for the preselected time after said initial energization.

6. A proximity switch according to claim 3 wherein said switching means comprises a semiconductor switching device connected to be connected between the source and the load having a gate electrode responsive to the application of a selected voltage to said gate electrode to turn on and thereby connect said source to said load.

7. A proximity switch according to claim 6 wherein said switching capacitor is connected to the gate electrode of the semiconductor switching device to turn on said semiconductor switching device when said switching capacitor reaches a preselected charge voltage.

8. A proximity switch according to claim 7 wherein said semiconductor switching device is a silicon controlled rectifier with the switching capacitor connected between the gate electrode and the cathode electrode of said silicon controlled rectifier and said switching means also comprises a threshold switching device connected between the switching capacitor and the gate electrode whereby said silicon controlled rectifier is turned on when the switching capacitor charge provides a voltage across said threshold device that equals or exceeds the threshold level of said threshold device.

9. A proximity switch according to claim 2 wherein said switching means comprises a semiconductor switching device connected between the source and the load having a gate electrode responsive to the application of a selected potential to said gate electrode to turn on and thereby connect the source to the load.

10. A proximity switch according to claim 9 wherein said switching control means comprises a time delay circuit responsive to the decrease in amplitude of the oscillating output from the sensing means to operate a preselected time after said decrease to produce the selected potential at the gate electrode of the semiconductor switching device.

11. A proximity switch according to claim 10 wherein said switching control means comprises a switching capacitor shunted by a control switching device with said semiconductor switching device connected to be turned off by the decrease in amplitude of the signal from the sensing means to thereby remove the shunt from said switching capacitor.

12. A proximity switch according to claim 11 wherein said semiconductor switching device is a silicon controlled rectifier with the switching capacitor connected between the gate electrode and the cathode electrode of said silicon controlled rectifier and said switching means also comprises a threshold switching device connected between the switching capacitor and the gate electrode whereby said silicon controlled rectifier is turned on when the switching capacitor charge provides a voltage across said threshold device that equals or exceeds the threshold level of said threshold device.

13. A proximity switch according to claim 11 also comprising a light-emitting diode connected in the discharge circuit of the switching capacitor to be energized by the discharge of said switching capacitor through the gate electrode of the semiconductor switching device.

14. A proximity switch according to claim 1 also comprising an indicating means for indicating the turning on of the switching means.

15. A proximity switch according to claim 14 wherein said sensing means comprises an oscillator circuit having an inductive device positioned as a sensing device for the proximity switch and adjusted to produce an oscillating output that decreases in amplitude to produce the signal for the switching control means upon presence of a metallic object within said selected distance from said inductive device.

16. A proximity switch according to claim 15 wherein said switching means comprises a semiconductor switching device connected to be connected between the source and load having a gate electrode responsive to the application of a selected voltage to said gate electrode to turn on and connect said source to said load.

17. A proximity switch according to claim 16 wherein said switching control means comprises a switching capacitor shunted by a control switching device with said control switching device connected to be turned on by the oscillating signal from the sensing means to thereby discharge said switching capacitor.

18. A proximity switch according to claim 17 wherein said indicating means comprises a light-emitting diode connected in the discharge circuit of the switching capacitor to be energized by the discharge of said switching capacitor through the gate electrode of the semiconductor switching device.

* * * * *

UNITED STATES PATENT AND TRADEMARK OFFICE
CERTIFICATE OF CORRECTION

PATENT NO. : 4,138,709
DATED : February 6, 1979
INVENTOR(S) : John A. Colwill

It is certified that error appears in the above-identified patent and that said Letters Patent are hereby corrected as shown below:

| COLUMN NO. | LINE NO. | DELETE | INSERT |
|---|---|---|---|
| 1 | 29 | "FIGURE" | -- figure -- |
| 1 | 31 | "FIGURE" | -- figure -- |
| 4 | 51 | "swing" | -- switching --. |

Signed and Sealed this

Fourteenth Day of August 1979

[SEAL]

Attest:

Attesting Officer

LUTRELLE F. PARKER
Acting Commissioner of Patents and Trademarks